(12) United States Patent
Kim et al.

(10) Patent No.: US 12,721,043 B2
(45) Date of Patent: Aug. 25, 2026

(54) MAGNETIC MEMORY DEVICE AND METHOD OF MANUFACTURING THE SAME

(71) Applicant: Samsung Electronics Co., Ltd., Suwon-si (KR)

(72) Inventors: Jae Hoon Kim, Suwon-si (KR); Hyeonwoo Seo, Suwon-si (KR); Youngjun Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 294 days.

(21) Appl. No.: 18/364,619

(22) Filed: Aug. 3, 2023

(65) Prior Publication Data

US 2024/0260477 A1 Aug. 1, 2024

(30) Foreign Application Priority Data

Feb. 1, 2023 (KR) ........................ 10-2023-0013755

(51) Int. Cl.
*H10N 50/01* (2023.01)
*H10B 61/00* (2023.01)
*H10N 50/10* (2023.01)

(52) U.S. Cl.
CPC ............ *H10N 50/01* (2023.02); *H10B 61/22* (2023.02); *H10N 50/10* (2023.02)

(58) Field of Classification Search
CPC ........ H10N 50/01; H10N 50/10; H10N 50/20; H10B 61/22; H10B 61/00; H10B 61/10; H01L 21/02697
See application file for complete search history.

(56) References Cited

U.S. PATENT DOCUMENTS

| | | | |
|---|---|---|---|
| 6,518,071 | B1 | 2/2003 | Durlam et al. |
| 9,118,001 | B2 | 8/2015 | Godet et al. |
| 9,362,336 | B2 | 6/2016 | Lu |
| 10,446,742 | B2 | 10/2019 | Gajek et al. |
| 10,971,681 | B2 | 4/2021 | Bozdag et al. |
| 11,211,549 | B1 | 12/2021 | Yang et al. |

(Continued)

FOREIGN PATENT DOCUMENTS

| | | |
|---|---|---|
| KR | 20190016372 A | 2/2019 |

*Primary Examiner* — Julio J Maldonado
*Assistant Examiner* — Alexander Michael Miller
(74) *Attorney, Agent, or Firm* — Harness, Dickey & Pierce, P.L.C.

(57) ABSTRACT

A method of manufacturing a magnetic memory device may include forming a bottom electrode layer on a substrate; forming a block structure on the bottom electrode layer; performing a first deposition process on the bottom electrode layer to form a pinned magnetic layer, a tunnel barrier layer, and a free magnetic layer on the bottom electrode layer; performing a second deposition process on the free magnetic layer to form a capping layer on the free magnetic layer; and performing an etching process after forming a hard mask on the capping layer to form magnetic tunnel junction patterns. The first deposition process may include irradiating a first beam toward the substrate. The second deposition process may include irradiating a second beam toward the substrate. The second beam may have a greater angle than the first beam with respect to a normal line perpendicular to an upper surface of the substrate.

20 Claims, 17 Drawing Sheets

(56) References Cited

U.S. PATENT DOCUMENTS

2019/0067168 A1 2/2019 Huang et al.
2020/0091412 A1 3/2020 Lee et al.
2020/0373352 A1* 11/2020 Kim .................... H01F 10/3286

* cited by examiner 180
110RU
TE2
160B
150B
140
TBR
130
120
MTJ2
DS2
BE
170
110
100U
I'
TE1
160A
150A
140
TB4
130
120
MTJ1
DS1
BE
115
102
104
106
100
I
D1
D2
D3

FIG. 13

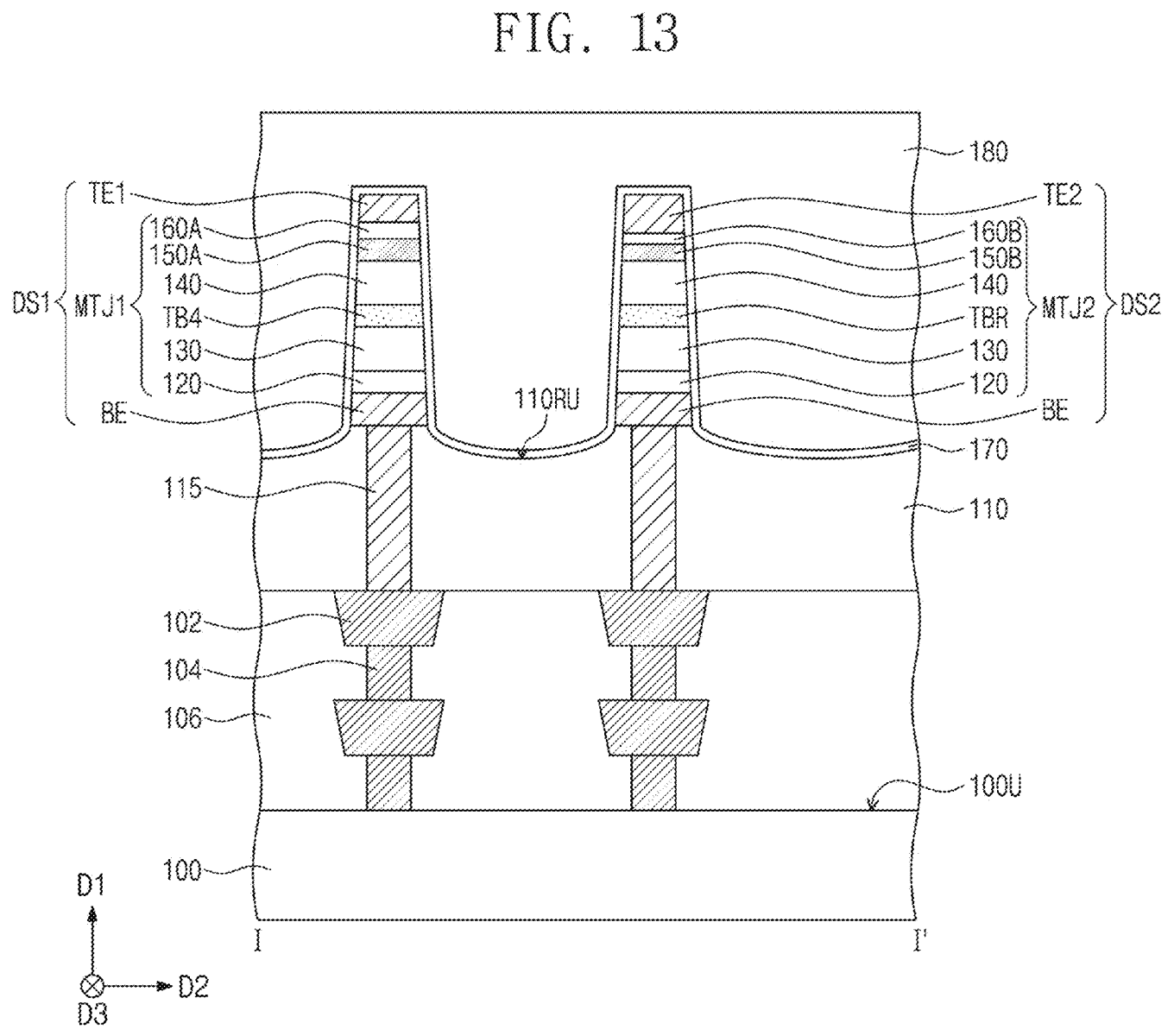

DS2
TE2
MTJ2
160B
150B
140
TBR
130
120
BE
180
170
110
100U
110RU
I'
DS1
TE1
MTJ1
160A
150A
140
TB4
130
120
BE
115
102
104
106
100
I
D1
D2
D3

DS2
TE2
MTJ2
BE
300
160B
150B
140
TBR
130
120
310
170
110
100U
I'
180
110RU
TE1
160A
150A
140
TB4
130
120
MTJ1
BE
DS1
115
102
104
106
100
I
D1
D2
D3

MAGNETIC MEMORY DEVICE AND METHOD OF MANUFACTURING THE SAME

CROSS-REFERENCE TO RELATED APPLICATIONS

This U.S. non-provisional patent application claims priority under 35 U.S.C. § 119 to Korean Patent Application No. 10-2023-0013755, filed on Feb. 1, 2023, in the Korean Intellectual Property Office, the entire contents of which are hereby incorporated by reference.

BACKGROUND

The present disclosure relates to a magnetic memory device including a magnetic tunnel junction and a method of manufacturing the same.

In general, a magnetic memory device may include a magnetic tunnel junction (MTJ) pattern. The magnetic tunnel junction pattern may include two magnetic layers and an insulating layer interposed therebetween. Resistance of the magnetic tunnel junction pattern varies depending on magnetization directions of the magnetic layers. For example, the magnetic tunnel junction pattern may have a high resistance value when magnetization directions of the magnetic layers are anti-parallel to each other and the magnetic tunnel junction pattern may have a low resistance value when magnetization directions of the magnetic layers are parallel to each other. Data may be stored into and/or read out from the magnetic tunnel junction pattern by using a difference between these resistance values.

Highly integrated and/or low-power magnetic memory devices have been increasingly demanded with the development of an electronic industry. Thus, research is being conducted to satisfy these demands.

SUMMARY

The present disclosure relates to a magnetic memory device with improved manufacturing process efficiency and/or a method of manufacturing the same.

A method of manufacturing a magnetic memory device according to some embodiments of the present disclosure may include forming a bottom electrode layer on a substrate; forming a block structure on the bottom electrode layer; performing a first deposition process on the bottom electrode layer to form a pinned magnetic layer, a tunnel barrier layer, and a free magnetic layer on the bottom electrode layer; performing a second deposition process on the free magnetic layer to form a capping layer on the free magnetic layer; and performing an etching process after forming a hard mask on the capping layer to form magnetic tunnel junction patterns. The first deposition process may include irradiating a first beam toward the substrate and the first beam may form a first angle with a normal line perpendicular to an upper surface of the substrate. The second deposition process may include irradiating a second beam toward the substrate and the second beam may form a second angle with the normal line. The second angle may be greater than the first angle.

A method of manufacturing a magnetic memory device according to some embodiments of the present disclosure may include providing a substrate including a block structure; performing a first deposition process including irradiating a first beam on the substrate to form a first deposition layer; and performing a second deposition process including irradiating a second beam on the first deposition layer to form a second deposition layer. The first beam may form a first angle with respect to a normal line perpendicular to an upper surface of the substrate. The second beam may form a second angle with respect to the normal line. The second angle may be greater than the first angle.

A method of manufacturing a magnetic memory device according to some embodiments of the present disclosure may include forming a lower interlayer insulating layer including lower wirings on a substrate, the substrate including a first region, a second region, and a third region neighboring in a first direction parallel to the substrate; forming a first interlayer insulating layer including lower contact plugs on the lower interlayer insulating layer; forming a bottom electrode layer on the lower interlayer insulating layer; forming a block structure on the bottom electrode layer, the block structure being formed on the third region of the substrate; performing a first deposition process on the bottom electrode layer, the first deposition process including irradiating a first beam having a first angle with a normal line perpendicular to an upper surface of the substrate, the first deposition process including forming a pinned magnetic layer, a tunnel barrier layer, and a free magnetic layer; performing a second deposition process on the free magnetic layer, the second deposition process including irradiating a second beam having a second angle with the normal line, the second deposition process forming a capping layer; performing a planarization process after forming a hard mask on the capping layer; performing an etching process on the hard mask to form magnetic tunnel junction patterns; and forming an upper wiring on the magnetic tunnel junction patterns. The second angle may be greater than the first angle. A thickness of the capping layer on the first region of the substrate may be greater than a thickness of the capping layer on the second region of the substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 5, 6, and 8 to 13 are views illustrating a method of manufacturing a magnetic memory device according to some embodiments of the present disclosure, and are cross-sectional views corresponding to line I-I' of FIG. 3.

DETAILED DESCRIPTION

Hereinafter, the present disclosure will be described in detail by describing embodiments of the present disclosure with reference to the accompanying drawings.

Figure 1:
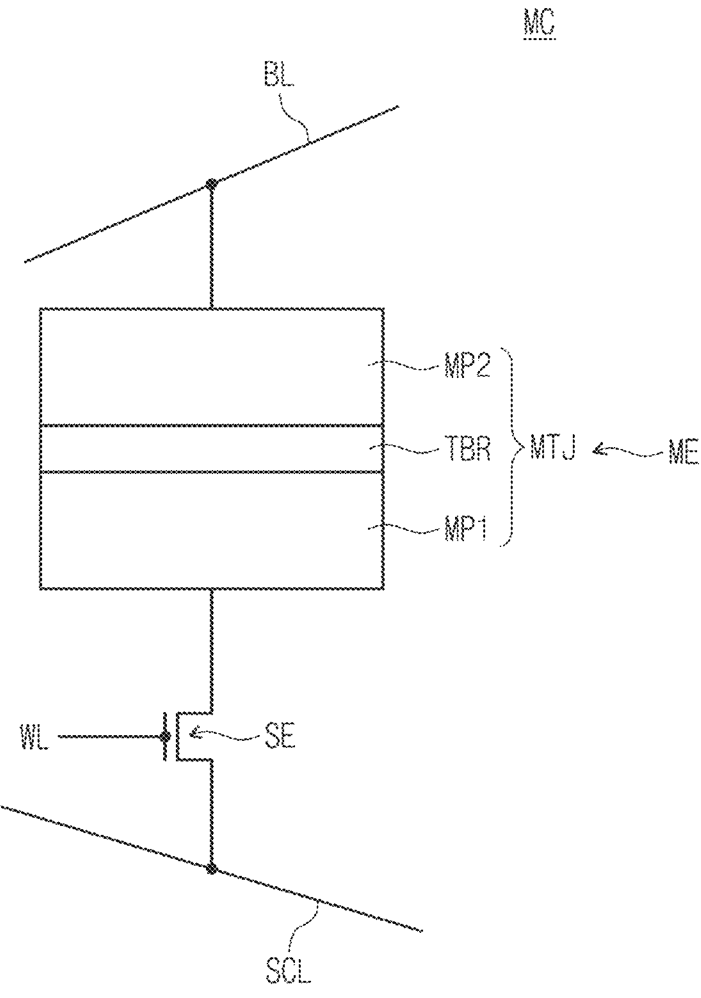
FIG. 1 is a circuit diagram illustrating a unit memory cell of a magnetic memory device according to some embodiments of the present disclosure.

FIG. 1 is a circuit diagram illustrating a unit memory cell of a magnetic memory device according to some embodiments of the present disclosure.

Referring to FIG. 1, a unit memory cell MC may include a memory element ME and a selection element SE. The memory element ME and the selection element SE may be electrically connected to each other in series. The memory element ME may be connected between a bit line BL and the selection element SE. The selection element SE may be connected between the memory element ME and a source line SCL and be controlled by a word line WL. The selection element SE may include, for example, a bipolar transistor or a MOS field effect transistor.

The memory element ME may include a magnetic tunnel junction (MTJ), and the magnetic tunnel junction MTJ may include a first magnetic pattern MP1, a second magnetic pattern MP2, and a tunnel barrier pattern TBR between the first and second magnetic patterns MP1 and MP2. One of the first and second magnetic patterns MP1 and MP2 may be a pinned magnetic pattern whose magnetization direction is fixed in a single direction regardless of an external magnetic field under ordinary use environment. The other of the first and second magnetic patterns MP1 and MP2 may be a free magnetic pattern whose magnetization direction is changed due to an external magnetic field between two stable magnetization directions. The magnetic tunnel junction pattern MTJ may have an electrical resistance whose value is much greater in case that the magnetization directions of the pinned and free magnetic patterns are anti-parallel to each other than in case that the magnetization directions of the pinned and free magnetic patterns are parallel to each other. That is, the electrical resistance of the magnetic tunnel junction pattern MTJ may be controlled by changing the magnetization direction of the free magnetic pattern. Therefore, the memory element ME may use the difference in electrical resistance, depending on the magnetization directions of the pinned and free magnetic patterns, as a mechanism that may cause the unit memory cell MC to store data therein.

Figure 2:
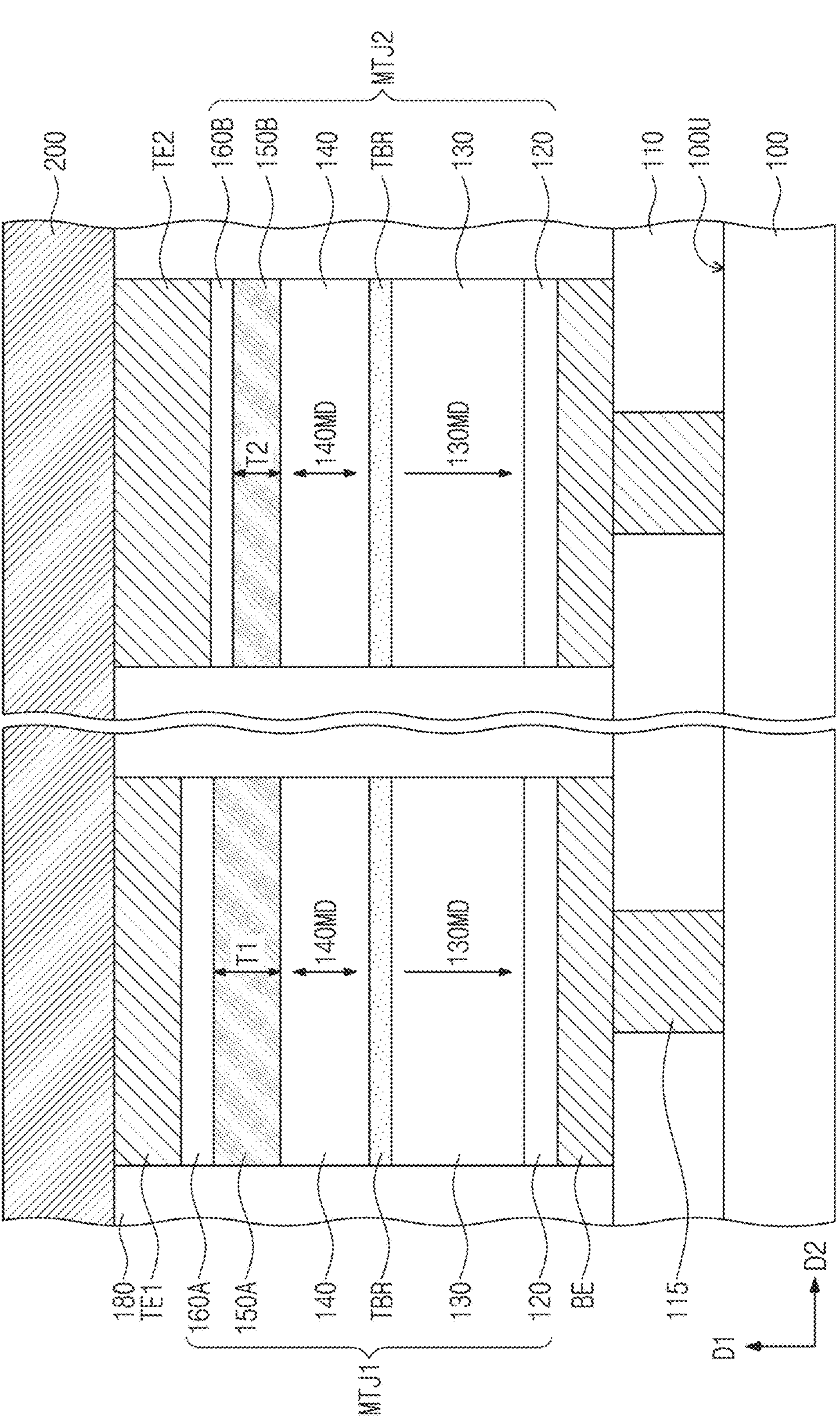
FIG. 2 is a cross-sectional view of a magnetic memory device according to some embodiments of the present disclosure.

FIG. 2 is a cross-sectional view of a magnetic memory device according to some embodiments of the present disclosure.

Referring to FIG. 2, a first insulating interlayer 110 may be disposed on a substrate 100, and lower contact plugs 115 may be disposed in the first insulating interlayer 110. The substrate 100 may be a semiconductor substrate including silicon, silicon on insulator (SOI), silicon germanium (SiGe), germanium (Ge), gallium arsenide (GaAs), or the like. The first interlayer insulating layer 110 may include, for example, oxide, nitride, and/or oxynitride.

Each of the lower contact plugs 115 may pass through and/or penetrate the first interlayer dielectric layer 110 and may electrically connect with the substrate 100. A selection element (see SE of FIG. 1) may be disposed in the substrate 100, and the selection element may be, for example, a field effect transistor. Each of the lower contact plugs 115 may be electrically coupled to one terminal (e.g., a source/drain terminal) of a corresponding one of the selection elements. The lower contact plug 115 may include at least one of doped semiconductor materials (e.g., doped silicon), metals (e.g., tungsten, titanium, and/or tantalum), metal-semiconductor compounds (e.g., metal silicide), and conductive metal nitride (e.g., titanium nitride, tantalum nitride, and/or tungsten nitride).

Bottom electrodes BE may be respectively disposed on the lower contact plugs 115. A first magnetic tunnel junction pattern MTJ1 and a first top electrode TE1 may be disposed on a first bottom electrode BE among the bottom electrodes, and a second magnetic tunnel junction pattern MTJ2 and a second top electrode TE2 may be disposed on a second bottom electrode BE among the bottom electrodes BE. The first bottom electrode BE, the first magnetic tunnel junction pattern MTJ1, and the first top electrode TE1 may be sequentially stacked in a first direction D1 perpendicular to an upper surface 100U of the substrate 100. The second bottom electrode BE, the second magnetic tunnel junction pattern MTJ2, and the second top electrode TE2 may be sequentially stacked in the first direction D1. The first magnetic tunnel junction pattern MTJ1 and the second magnetic tunnel junction pattern MTJ2 may be spaced apart from each other in a second direction D2 parallel to the upper surface 100U of the substrate 100. The first magnetic tunnel junction pattern MTJ1 may be disposed between the first bottom electrode BE and the first top electrode TE1, and the second magnetic tunnel junction pattern MTJ2 may be disposed between the second bottom electrode BE and the second top electrode TE2. The bottom electrodes BE may be electrically connected to the lower contact plugs 115, respectively. The bottom electrodes BE may include, for example, conductive metal nitride (e.g., titanium nitride or tantalum nitride). The top electrode TE may include at least one of a metal (e.g., Ta, W, Ru, Ir, etc.) and a conductive metal nitride (e.g., TiN).

The first magnetic tunnel junction pattern MTJ1 may include a pinned magnetic pattern 130, a free magnetic pattern 140, and a tunnel barrier pattern TBR between the pinned magnetic pattern 130 and the free magnetic pattern 140. According to some embodiments, the pinned magnetic pattern 130 may be disposed between the first bottom electrode BE and the tunnel barrier pattern TBR, and the free magnetic pattern 140 may be disposed between the first top electrode TE1 and the tunnel barrier pattern TBR. The first magnetic tunnel junction pattern MTJ1 may further include a seed pattern 120 between the first bottom electrode BE and the pinned magnetic pattern 130, a first capping pattern 150A between the first top electrode TE1 and the free magnetic pattern 140, and a first upper capping pattern 160A between the first capping pattern 150A and the first top electrode TE1.

The seed pattern 120 may include a material that helps crystal growth of the pinned magnetic pattern 130. The seed pattern 120 may include, for example, at least one of chromium (Cr), iridium (Ir), and ruthenium (Ru).

The pinned magnetic pattern 130 may have a magnetization direction 130MD fixed in one direction. The magnetization direction 130MD of the pinned magnetic pattern 130 may be perpendicular to an interface between the tunnel barrier pattern TBR and the free magnetic pattern 140. The pinned magnetic pattern 130 may include a magnetic element. The pinned magnetic pattern 130 may include at least one of iron (Fe), cobalt (Co), and nickel (Ni). For example, the pinned magnetic pattern 130 may include at least one of an intrinsic perpendicular magnetic material and an extrinsic perpendicular magnetic material. The intrinsic perpendicular magnetic material may include a material having perpendicular magnetization characteristics even when there is no external factor. The intrinsic perpendicular magnetic material may include at least one of i) a perpendicular magnetic material (e.g., CoFeTb, CoFeGd, CoFeDy), ii) a perpendicular magnetic material having an L10 structure, iii) CoPt having a hexagonal close packed lattice structure, and iv) a vertical magnetic structure. The perpendicular magnetic material having the L10 structure may include at least one of L10 structure FePt, L10 structure FePd, L10 structure CoPd, or L10 structure CoPt. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n ("n" is the number of stacking). The extrinsic perpendicular magnetic material may include a material having intrinsic horizontal magnetization characteristics and perpendicular magnetization characteristics due to an external factor. For example, the extrinsic perpendicular magnetic material may have the perpendicular magnetization characteristic due to magnetic anisotropy induced by junction of the pinned magnetic pattern 130 and the tunnel barrier pattern TBR. The extrinsic perpendicular magnetic material may include, for example, CoFeB. The pinned magnetic pattern 130 may include a Co-based Heusler alloy.

The tunnel barrier pattern TBR may include a metal oxide layer. The tunnel barrier pattern TBR may include at least one of, for example, a magnesium (Mg) oxide layer, a titanium (Ti) oxide layer, an aluminum (Al) oxide layer, a magnesium-zinc (Mg—Zn) oxide layer, or a magnesium-boron (Mg—B) oxide layer.

The free magnetic pattern 140 may have a magnetization direction 140MD changeable parallel to or anti-parallel to the magnetization direction 130MD of the pinned magnetic pattern 130. The magnetization direction 140MD of the free magnetic pattern 140 may be perpendicular to an interface between the tunnel barrier pattern TBR and the free magnetic pattern 140.

The free magnetic pattern 140 may include a magnetic element. The first free magnetic pattern 142 may include at least one of iron (Fe), cobalt (Co), and nickel (Ni). For example, the free magnetic pattern 140 may include cobalt-iron (CoFe). As another example, the free magnetic pattern 140 may include at least one of the perpendicular magnetic material (e.g., CoFeTb, CoFeGd, CoFeDy), the perpendicular magnetic material having the L10 structure, the CoPt having the hexagonal close packed lattice structure, and the vertical magnetic structure. The free magnetic pattern 140 may include a magnetic material having perpendicular magnetization characteristics due to magnetic anisotropy induced by junction of the free magnetic pattern 140 and the tunnel barrier pattern TBR. For example, the free magnetic pattern 140 may include cobalt-iron-boron (CoFeB). The free magnetic pattern 140 may include a Co-based Heusler alloy.

The first capping pattern 150A may be disposed between the free magnetic pattern 140 and the first upper capping pattern 160A. The first capping pattern 150A may be used to enhance vertical anisotropy of the free magnetic pattern 140. The first capping pattern 150A may include a first non-magnetic metal. The first capping pattern 150A may further include oxygen. For example, the first nonmagnetic metal may include tantalum (Ta).

The first upper capping pattern 160A may include a second non-magnetic metal. The second non-magnetic metal may be different from the first non-magnetic metal. For example, the second non-magnetic metal may include at least one of molybdenum (Mo), tungsten (W), chromium (Cr), rhenium (Re), and manganese (Mn). According to some embodiments, the first upper capping pattern 160A may further include oxygen. In this case, the first upper capping pattern 160A may include an oxide of the second nonmagnetic metal.

The second magnetic tunnel junction pattern MTJ2 may include a pinned magnetic pattern 130, a free magnetic pattern 140, and a tunnel barrier pattern TBR between the pinned magnetic pattern 130 and the free magnetic pattern 140. The second magnetic tunnel junction pattern MTJ2 may further include a seed pattern 120 between the second bottom electrode BE and the pinned magnetic pattern 130, a second capping pattern 150B between the second top electrode TE2 and the free magnetic pattern 140, and a second upper capping pattern 160B between the second capping pattern 150B and the second top electrode TE2. A thickness T1 of the first capping pattern 150A may be greater than a thickness T2 of the second capping pattern 150B.

In the first and second magnetic tunnel junction patterns MTJ1 and MTJ2, the first capping pattern 150A and the second capping pattern 150B that are in contact with the free magnetic pattern 140 may have different thicknesses. Accordingly, characteristics of the first magnetic tunnel junction pattern MTJ1 and the second magnetic tunnel junction pattern MTJ2 may be different.

A second interlayer insulating layer 180 may be disposed on the first interlayer insulating layer 110, and may cover side surfaces of the bottom electrodes BE, first and second magnetic tunnel junction patterns MTJ1 and MTJ2, and first and second top electrodes TE1 and TE2. The second interlayer insulating layer 180 may include, for example, oxide, nitride, and/or oxynitride.

An upper wiring 200 may be disposed on the second interlayer insulating layer 180 and may be connected to the first and second top electrodes TE1 and TE2. The upper wiring 200 may be connected to the first and second magnetic tunnel junction patterns MTJ1 and MTJ2 through the first and second top electrodes TE1 and TE2, and may function as a bit line (BL of FIG. 1). The upper wiring 200 may include at least one of a metal (e.g., copper) and a conductive metal nitride.

Figure 3:
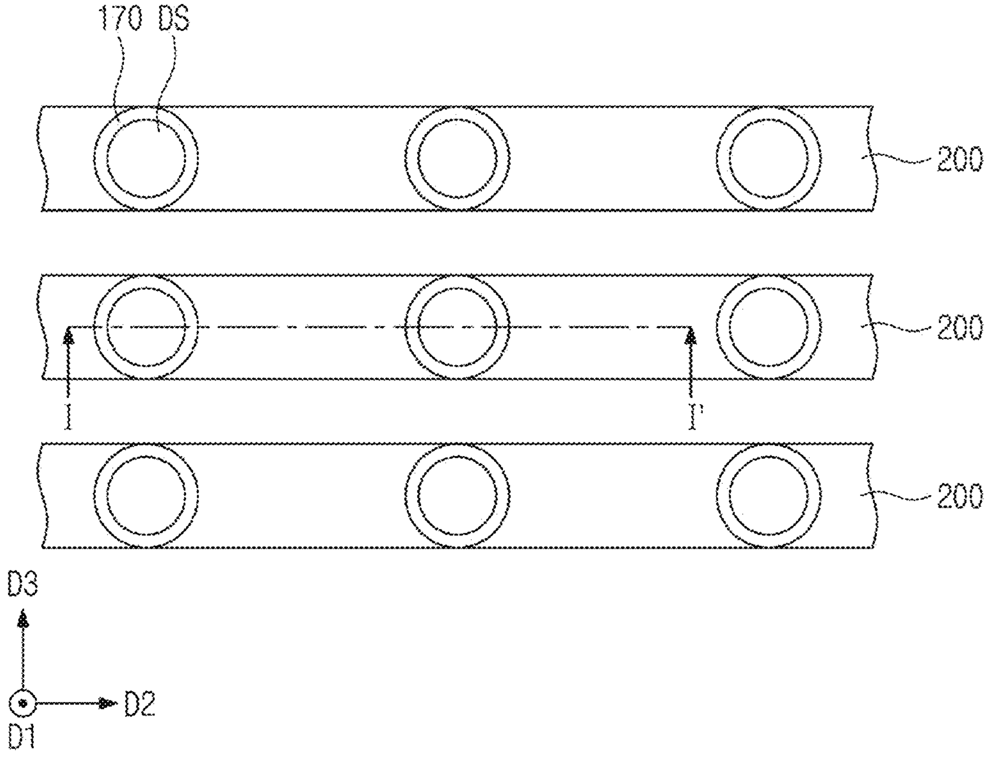
FIG. 3 is a plan view of a magnetic memory device according to some embodiments of the present disclosure.
Figure 4:
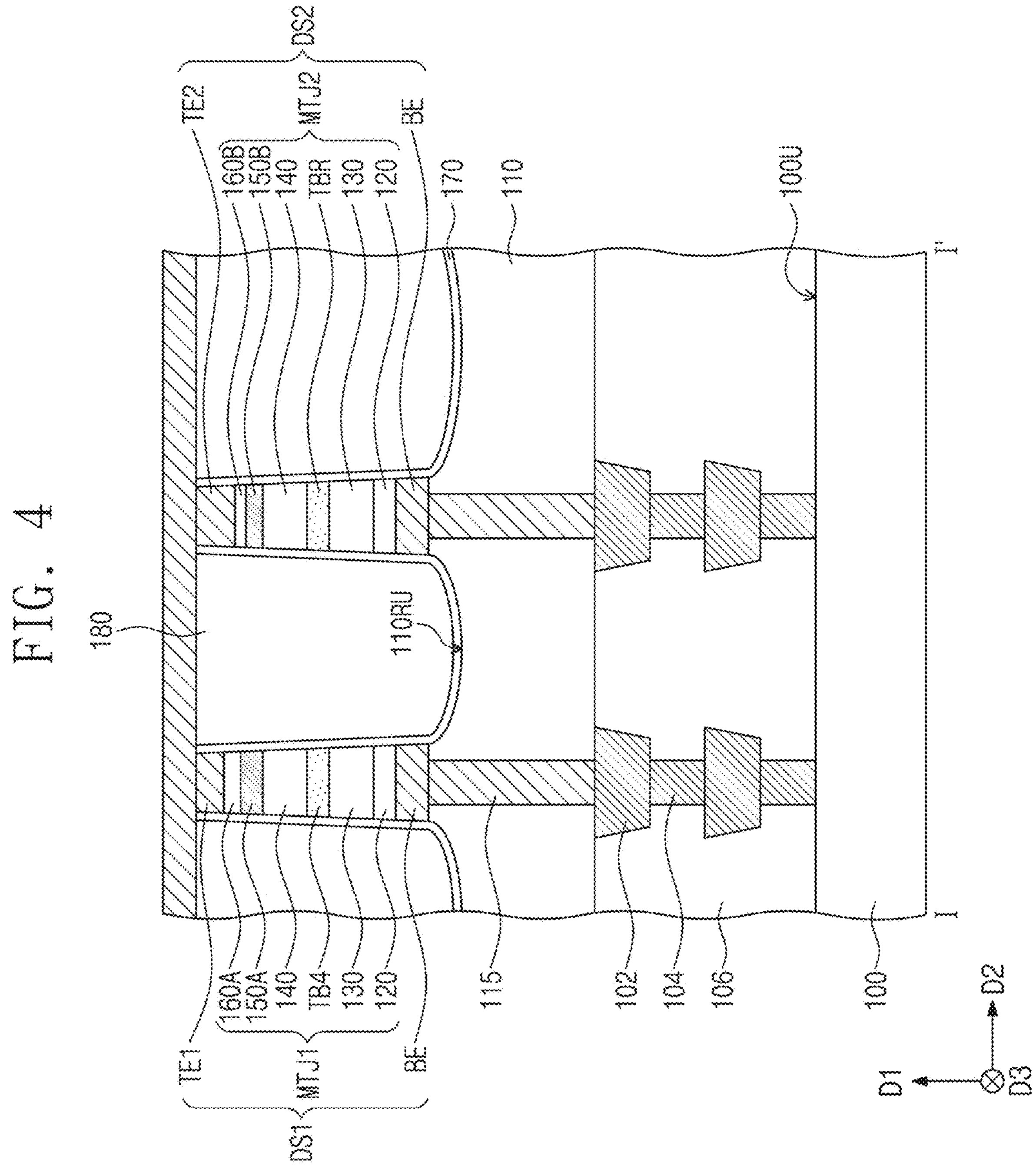
FIG. 4 is a cross-sectional view taken along line I-I' of FIG. 3.

FIG. 3 is a plan view of a magnetic memory device according to some embodiments of the present disclosure, and FIG. 4 is a cross-sectional view taken along line I-I' of FIG. 3. For simplicity of description, descriptions overlapping those of the magnetic memory device described with reference to FIGS. 1 and 2 will be omitted.

Referring to FIGS. 3 and 4, lower wirings 102 and lower contacts 104 may be disposed on a substrate 100. The lower wirings 102 may be spaced apart from an upper surface 100U of the substrate 100 in a first direction D1 perpendicular to the upper surface 100U of the substrate 100. The lower contacts 104 may be disposed between the substrate 100 and the lower wirings 102, and each of the lower wirings 102 may be electrically connected to the substrate 100 through a corresponding one of the lower contacts 104. The lower wirings 102 and the lower contacts 104 may include metal (e.g., copper).

Select elements (SE in FIG. 1) may be disposed in the substrate 100. The selection elements may be, for example, field effect transistors. Each of the lower wirings 102 may be electrically connected to a terminal (e.g., a source/drain terminal) of a corresponding one of the selection elements through a corresponding lower contact 104.

A lower interlayer insulating layer 106 may be disposed on the substrate 100 and may cover the lower wirings 102 and the lower contacts 104. Upper surfaces of uppermost lower wirings 102 among the lower wirings 102 may be coplanar with an upper surface of the lower interlayer insulating layer 106. The upper surfaces of the uppermost lower wirings 102 may be positioned at substantially the same height as the upper surface of the lower interlayer insulating layer 106. In this specification, a height means a distance measured in the first direction D1 from the upper surface 100U of the substrate 100. The lower interlayer insulating layer 106 may include, for example, oxide, nitride, and/or oxynitride.

A first interlayer insulating layer 110 may be disposed on the lower interlayer insulating layer 106 and may cover the upper surfaces of the uppermost lower wirings 102.

A plurality of lower contact plugs 115 may be disposed in the first interlayer insulating layer 110. The plurality of lower contact plugs 115 may be spaced apart from each other in a second direction D2 and a third direction D3 parallel to the upper surface 110U of the substrate 100 and crossing the second direction D2. Each of the plurality of lower contact plugs 115 may pass through the first interlayer insulating layer 110 and be connected to a corresponding lower wiring 102 among the lower wirings 102. Each of the plurality of lower contact plugs 115 may be electrically connected to a corresponding one terminal (e.g., a source/drain terminal) of the selection elements through the corresponding lower wiring 102.

A plurality of data storage patterns DS may be disposed on the first interlayer insulating layer 110 and may be spaced apart from each other in the second direction D2 and the third direction D3. The plurality of data storage patterns DS may be respectively disposed on the plurality of lower contact plugs 115 and may be respectively connected to the plurality of lower contact plugs 115.

The plurality of data storage patterns DS may include a first data storage pattern DS1 and a second data storage pattern DS2. The first data storage pattern DS1 may include a first bottom electrode BE, a first magnetic tunnel junction pattern MTJ1, and a first top electrode TE1 sequentially stacked on a corresponding lower contact plug 115. The second data storage pattern DS2 may include a second bottom electrode BE, a second magnetic tunnel junction pattern MTJ2, and a second top electrode TE2 sequentially stacked on a corresponding lower contact plug 115. The first bottom electrode BE, the first magnetic tunnel junction pattern MTJ1, and the first top electrode TE1 may be substantially the same as the first bottom electrode BE, the first magnetic tunnel junction pattern MTJ1, and the first top electrode TE1 described with reference to FIG. 2. The second bottom electrode BE, the second magnetic tunnel junction pattern MTJ2, and the second top electrode TE2 may substantially the same as the second bottom electrode BE, the second magnetic tunnel junction pattern MTJ2, and the second top electrode TE2 described with reference to FIG. 2.

According to some embodiments, an upper surface of the first interlayer insulating layer 110 may be recessed toward the substrate 100 between the plurality of data storage patterns DS. A protective insulating layer 170 may surround each side surface of the plurality of data storage patterns DS. The protective insulating layer 170 may cover side surfaces of the bottom electrode BE, first and second magnetic tunnel junction patterns MTJ1 and MTJ2, and first and second top electrodes TE1 and TE2, and may surround the side surfaces of the bottom electrode BE, first and second magnetic tunnel junction patterns MTJ1 and MTJ2, and first and second top electrodes TE1 and TE2 when viewed in a plan view. The protective insulating layer 170 may extend from each side surface of the plurality of data storage patterns DS onto a recessed upper surface 110RU of the first interlayer insulating layer 110. The protective insulating layer 170 may conformally cover the recessed upper surface 110RU of the first interlayer insulating layer 110. The protective insulating layer 170 may include nitride (e.g., silicon nitride).

A second interlayer insulating layer 180 may be disposed on the first interlayer insulating layer 110 and may cover the plurality of data storage patterns DS. The protective insulating layer 170 may be interposed between each side surface of the plurality of data storage patterns DS and the second interlayer insulating layer 180, and may extend between the recessed upper surface 110RU of the first interlayer insulating layer 110 and the second interlayer insulating layer 180.

A plurality of upper wirings 200 may be disposed on the second interlayer insulating layer 180. The plurality of upper wirings 200 may extend in the second direction D2 and may be spaced apart from each other in the third direction D3. Each of the plurality of upper wirings 200 may be connected to data storage patterns DS spaced apart from each other in the second direction D2 among the plurality of data storage patterns DS.

FIGS. 5, 6, and 8 to 13 are views illustrating a method of manufacturing a magnetic memory device according to some embodiments of the present disclosure, and are cross-sectional views corresponding to line I-I' of FIG. 3. FIGS. 7A and 7B are schematic diagrams for illustrating a method of manufacturing a magnetic memory device according to some embodiments of the present disclosure. For simplicity of description, descriptions overlapping those of the magnetic memory device described with reference to FIGS. 1 to 4 will be omitted.

Figure 5:
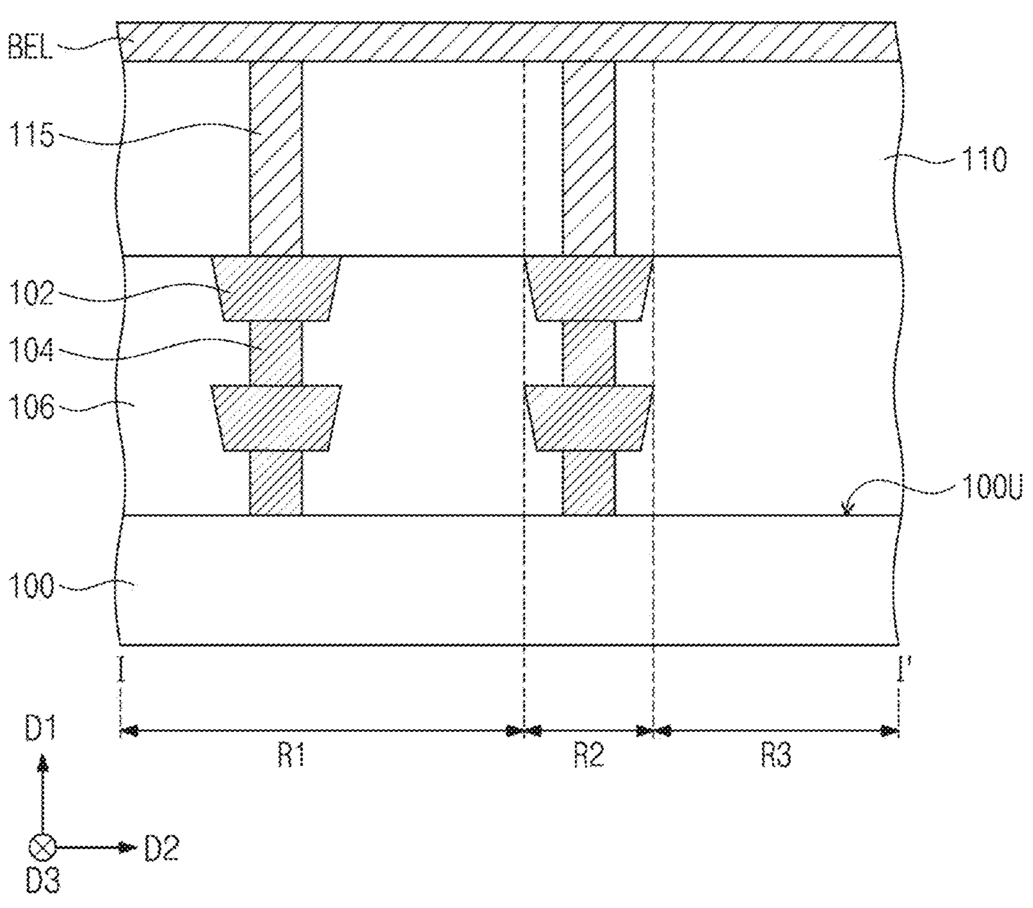

Referring to FIG. 5, a substrate 100 may be provided. Selection elements (SE in FIG. 1) may be formed in the substrate 100, and lower wirings 102 and lower contacts 104 may be formed on the substrate 100. Each of the lower wirings 102 may be electrically connected to one terminal (e.g., a source/drain terminal) of a corresponding one of the selection elements through a corresponding one of the lower contacts 104. The substrate 100 may include a first region R1, a second region R2, and a third region R3 neighboring in a second direction D2. The second region R2 may be disposed between the first region R1 and the third region R3. The lower wirings 102 and the lower contacts 104 may be formed on the first region R1 and the second region R2 of the substrate 100. A lower interlayer insulating layer 106 may be formed on the substrate 100 to cover the lower wirings 102 and the lower contacts 104. Upper surfaces of uppermost lower wirings 102 among the lower wirings 102 may be coplanar with an upper surface of the lower interlayer insulating layer 106.

A first interlayer insulating layer 110 may be formed on the lower interlayer insulating layer 106, and a plurality of lower contact plugs 115 may be formed in the first interlayer insulating layer 110. Each of the plurality of lower contact plugs 115 may pass through the first interlayer insulating layer 110 and be connected to a corresponding lower wiring 102 among the lower wirings 102. Forming the plurality of lower contact plugs 115 may include, for example, forming lower contact holes penetrating the first interlayer insulating layer 110, forming a lower contact layer filling the lower contact holes on the first interlayer insulating layer 110, and planarizing the lower contact layer until an upper surface of the first interlayer insulating layer 110 is exposed.

A bottom electrode layer BEL may be formed on the first interlayer insulating layer 110. For example, the bottom electrode layer BEL may be formed through sputtering, chemical vapor deposition, or atomic layer deposition.

Figure 6:
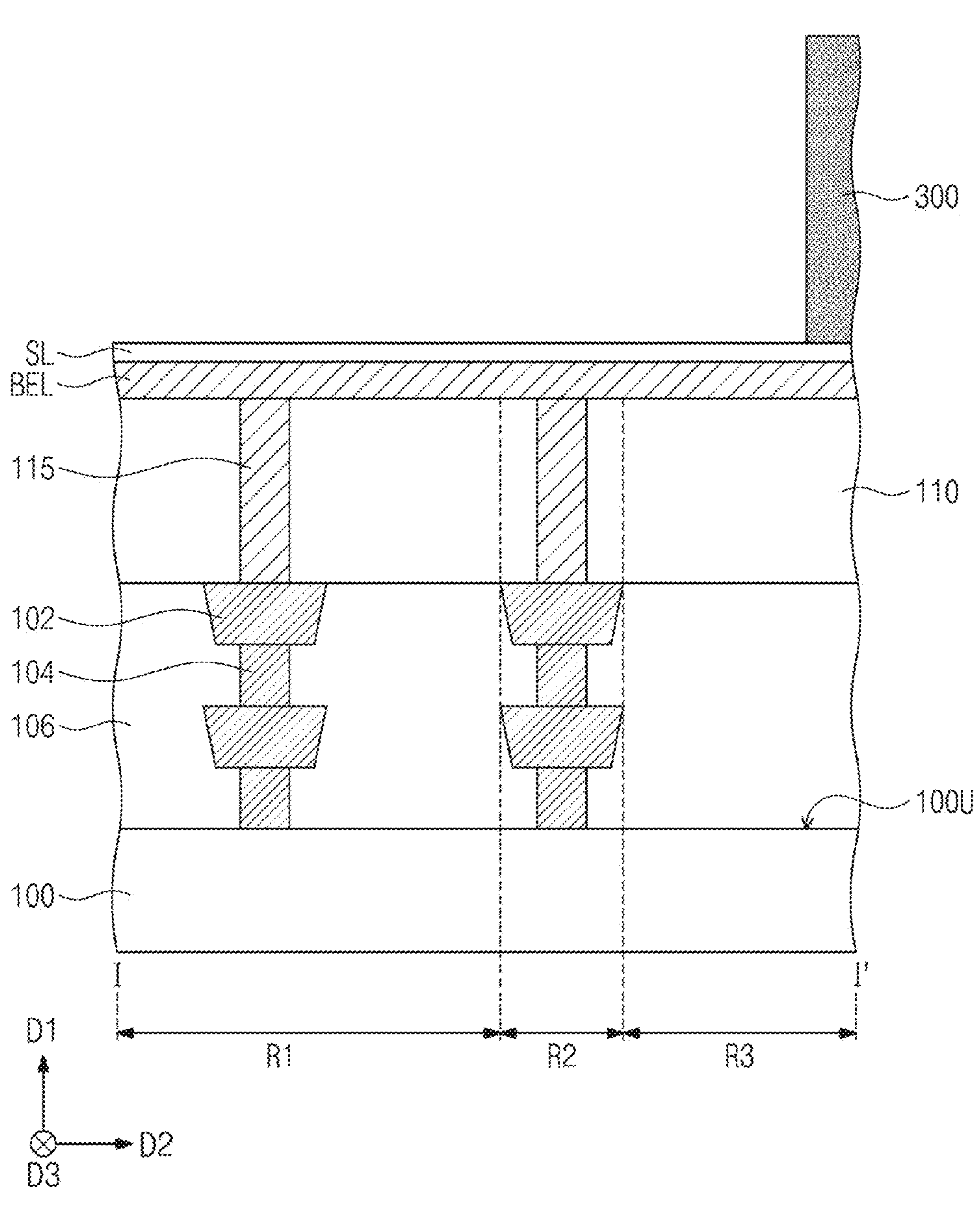
Figure 7A:
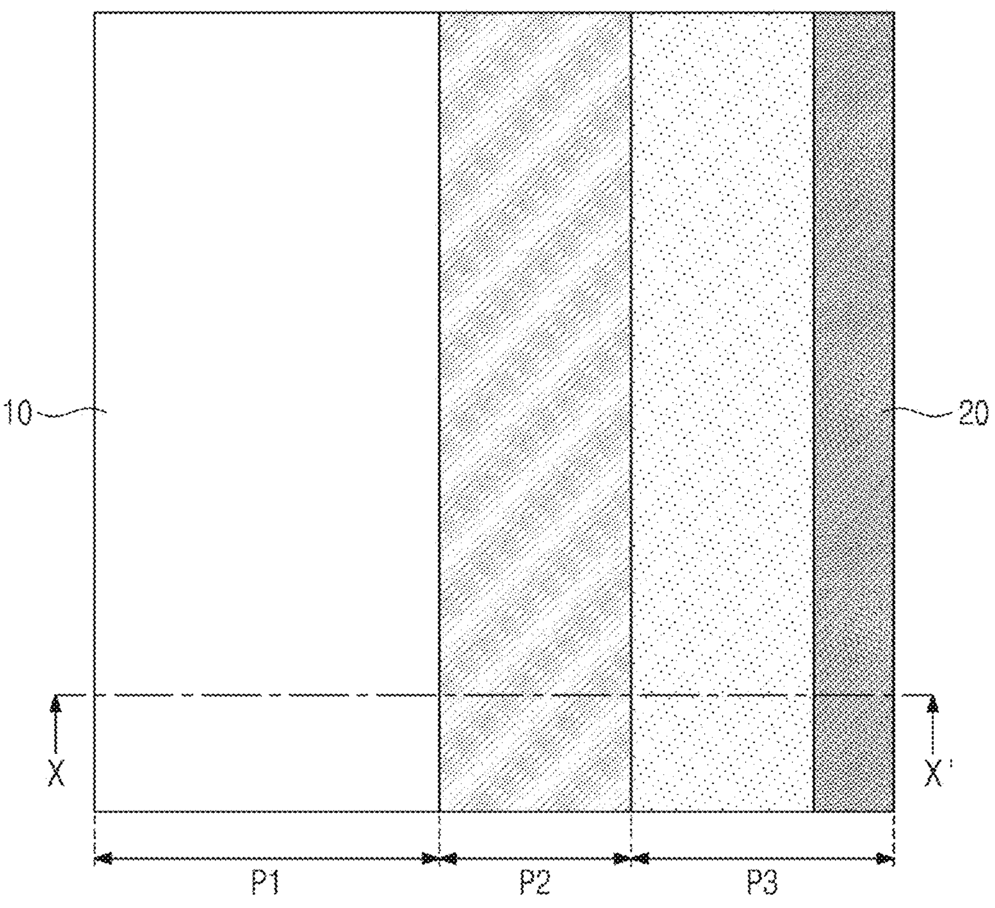
FIGS. 7A and 7B are schematic diagrams for illustrating a method of manufacturing a magnetic memory device according to some embodiments of the present disclosure.
Figure 7B:
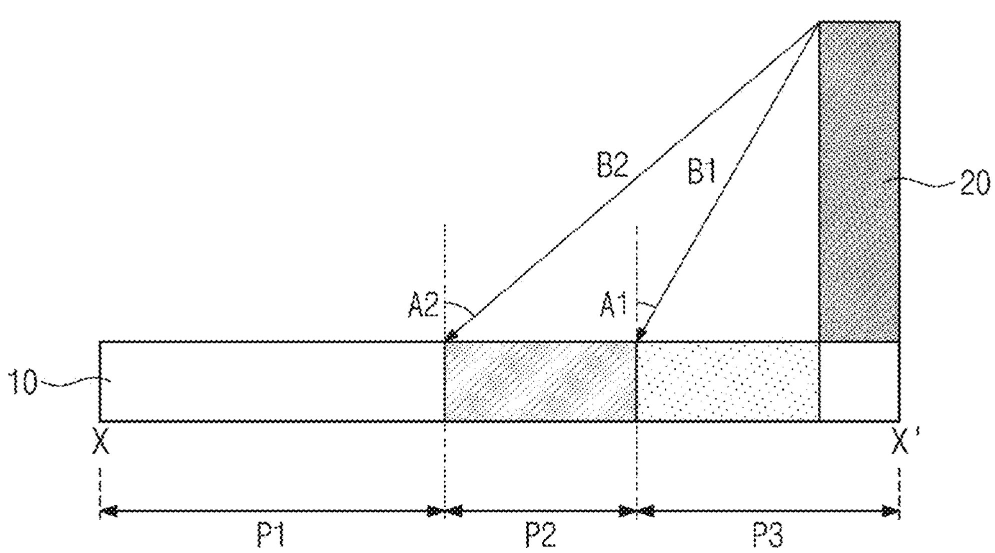

Referring to FIG. 6, an etch stop layer SL may be formed on the bottom electrode layer BEL. The etch stop layer SL may cover an upper surface of the bottom electrode layer BEL. A block structure 300 may be formed on the etch stop layer SL. The block structure 300 may be formed on the third region R3 of the substrate 100. The block structure 300 may have a shape of a wall or a pillar extending in the first direction D1. For example, the block structure 300 may include silicon oxide.

Prior to describing a manufacturing method to be described later, a schematic diagram for helping understanding of the deposition process will be first described. Referring to FIGS. 7A and 7B, a deposition target 10 may be provided. The deposition target 10 may include a first part P1, a second part P2, and a third part P3 adjacent to each other. The second part P2 may be disposed between the first part P1 and the third part P3. A deposition impediment 20 may be provided on the third part P3 of the deposition target 10.

A first beam B1 may be irradiated onto the deposition target 10 to form a first angle A1 with respect to a normal line perpendicular to an upper surface of the deposition target 10. Due to the deposition impediment 20, the first beam B1 may be directly irradiated more on the first part P1 and the second part P2 than on the third part P3 of the deposition target 10. Therefore, when the first beam B1 is irradiated, an irradiated material may be deposited more concentrated on the first part P1 and the second part P2 than on the third part P3 of the deposition target 10.

A second beam B2 may be irradiated onto the deposition target 10 to form a second angle A2 with respect to the normal line. In this case, the second angle A2 may be greater than the first angle A1. Due to the interference of the deposition impediment 20, the second beam B2 may be irradiated more on the first part P1 than the second part P2 and the third part P3 of the deposition target 10. Therefore, when the second beam B2 is irradiated, the irradiated material may be deposited more on the first part P1 than to the third part P3 and the second part P2 of the deposition target 10. The irradiation angle of the beam to the deposition target 10 may be adjusted to have different thicknesses for each part.

As the first angle A1 and the second angle A2 are smaller, deposition may be performed in a wider area, and as the first angle A1 and the second angle A2 are larger, the deposition is performed in a narrower area. The deposition area may be adjusted by adjusting the irradiation angle and a height of the deposition impediment 20.

Figure 8:
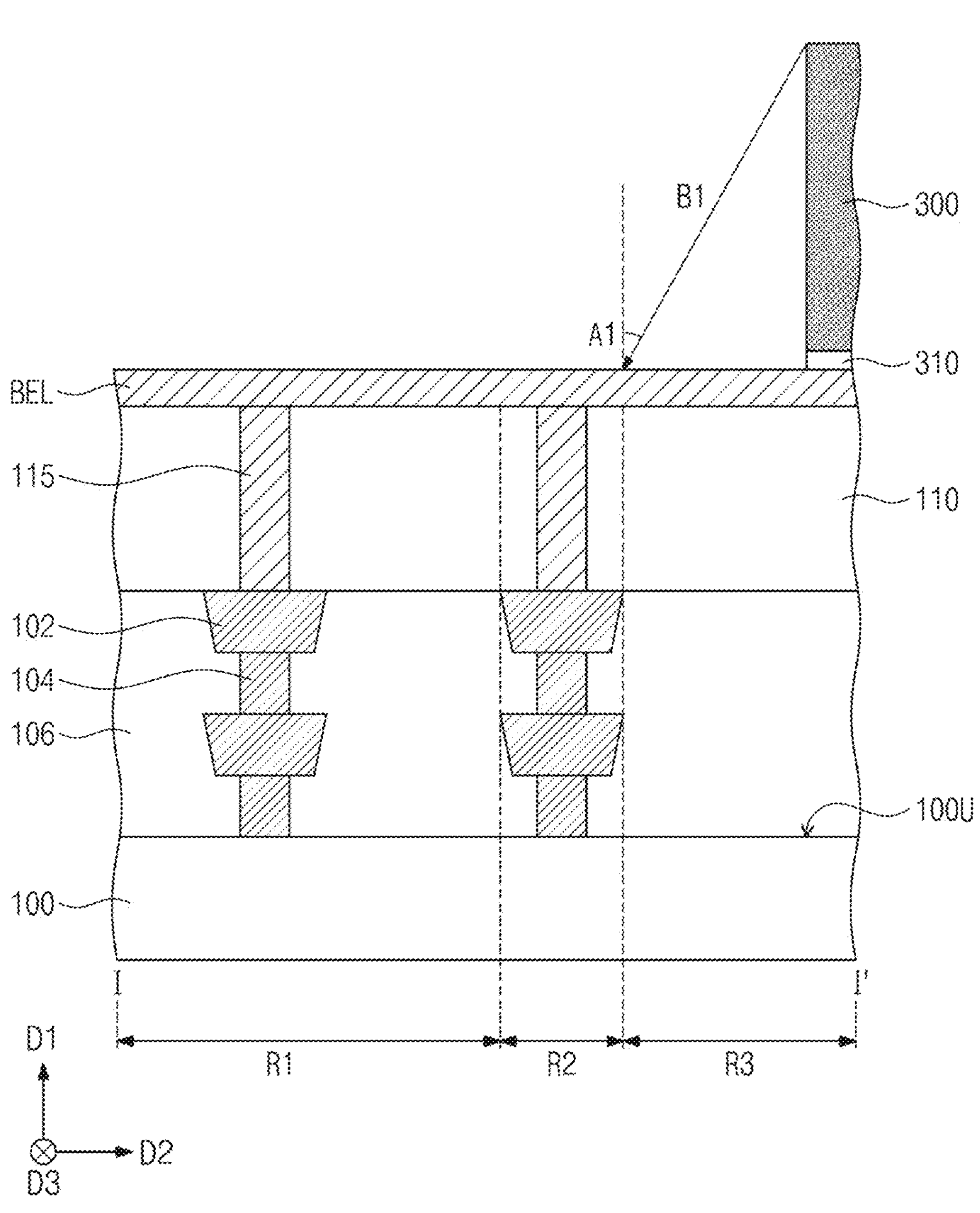

Referring to FIG. 8, the etch stop layer SL may be etched to form an etch stop pattern 310. The etch stop pattern 310 may be formed between the block structure 300 and the bottom electrode layer BEL. The etch stop pattern 310 may expose the bottom electrode layer BEL in a portion where the block structure 300 is not formed. A first deposition process may be performed on the bottom electrode layer BEL. The first deposition process may include irradiating a first beam B1. The first beam B1 may form a first angle A1 with respect to a normal line perpendicular to the upper surface 100U of the substrate 100. Due to the interference of the block structure 300, the first beam B1 may be irradiated more on the first region R1 and the second region R2 than on the third region R3 of the substrate.

Figure 9:
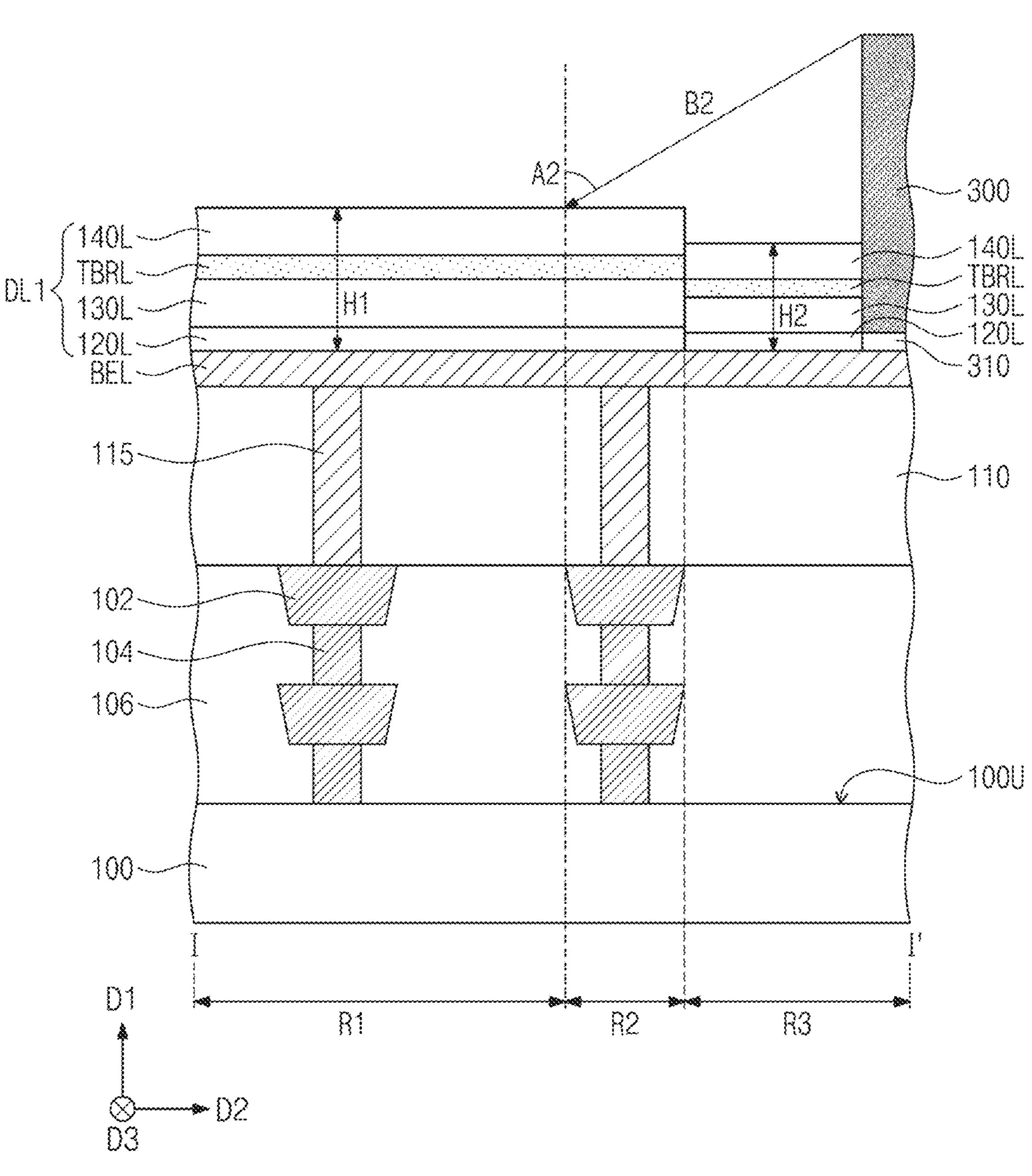

Referring to FIG. 9, a first deposition layer DL1 may be formed by the first deposition process. The first deposition layer DL1 may include a seed layer 120L, a pinned magnetic layer 130L, a tunnel barrier layer TBRL, and a free magnetic layer 140L sequentially stacked on the bottom electrode layer BEL. The first deposition process may include sequentially depositing the seed layer 120L, the pinned magnetic layer 130L, the tunnel barrier layer TBRL, and the free magnetic layer 140L. The first deposition layer DL1 may be formed by, for example, sputtering, chemical vapor deposition, or atomic layer deposition. A thickness H1 of the first deposition layer DL1 at the first region R1 and the second region R2 of the substrate 100 may be greater than a thickness H2 of the first deposition layer DL1 at the third region R3.

A second deposition process may be performed on the first deposition layer DL1. The second deposition process may include irradiating a second beam B2. The second beam B2 may form a second angle A2 with respect to a normal line perpendicular to the upper surface 100U of the substrate 100. The second angle A2 may be greater than the first angle A1. The second angle may be 30° to 60°. Due to the interference of the block structure 300, the second beam B2 may be irradiated more on the first region R1 than on the second region R2 and the third region R3 of the substrate.

Figure 10:
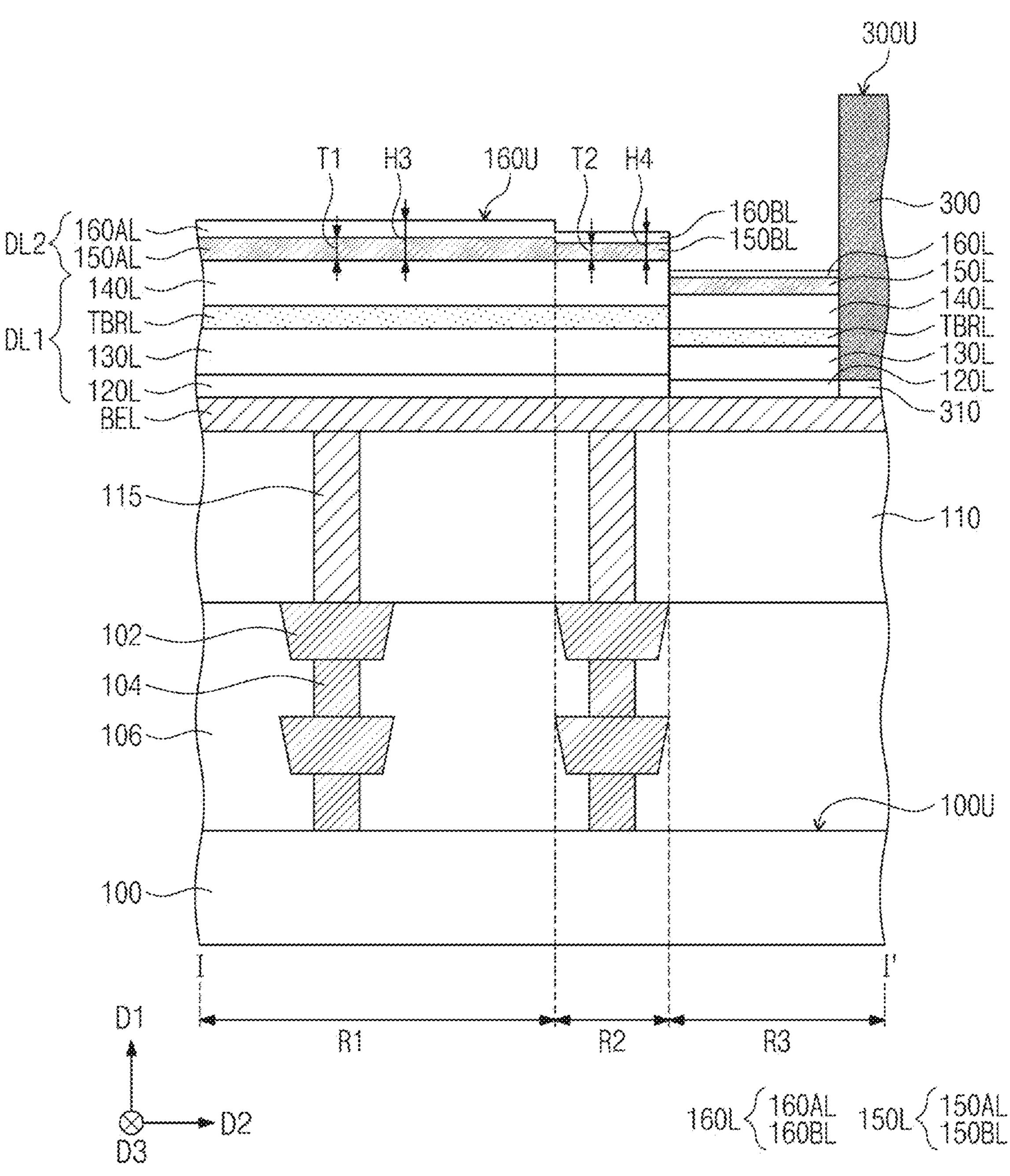

Referring to FIG. 10, a second deposition layer DL2 may be formed by the second deposition process. A thickness H3 of the second deposition layer DL2 at the first region R1 of the substrate 100 may be greater than a thickness H4 of the second deposition layer DL2 at the second region R2 and the third region R3. The second deposition layer DL2 may be formed by, for example, sputtering, chemical vapor deposition, or atomic layer deposition.

The second deposition layer DL2 may include a capping layer 150L on the first deposition layer DL1. The capping layer 150L may include a first capping layer 150AL at the first region R1 of the substrate and a second capping layer 150BL at the second region R2 of the substrate. A thickness T1 of the first capping layer 150AL may be greater than a thickness T2 of the second capping layer 150BL.

The second deposition layer DL2 may further include an upper capping layer 160L. The upper capping layer 160L may include a first upper capping layer 160AL at the first region R1 of the substrate and a second upper capping layer 160BL at the second region R2 of the substrate. An upper surface 300U of the block structure 300 may be higher than an uppermost surface 160U of the second deposition layer DL2.

Figure 11:
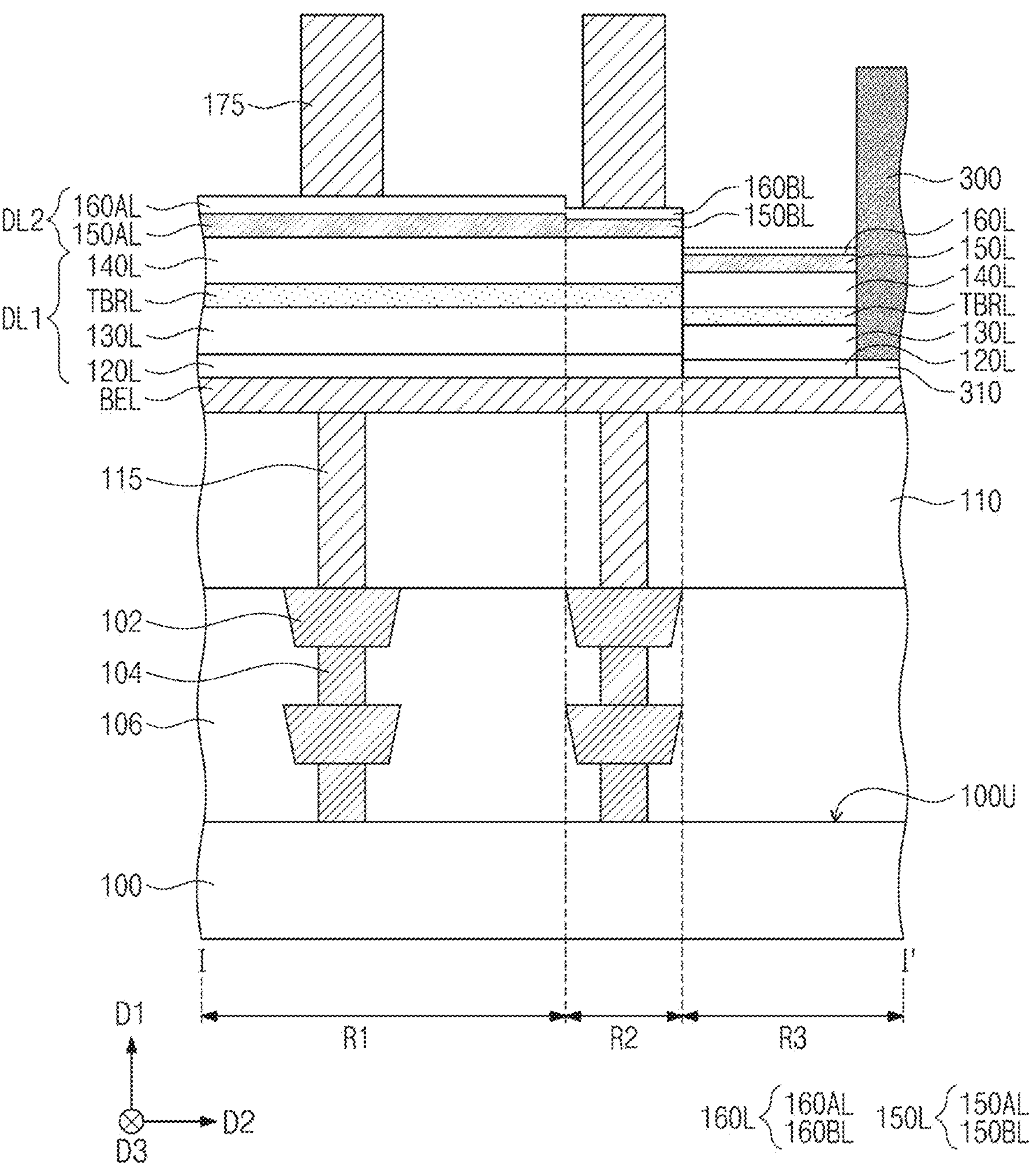

Referring to FIG. 11, hard masks 175 may be formed on the second deposition layer DL2. The hard masks 175 may define regions where magnetic tunnel junction patterns to be described later are to be formed. After forming the hard masks 175, a planarization process may be performed. Accordingly, upper surfaces of the hard masks 175 on the first region R1 of the substrate and the hard masks 175 on the second region R2 may be positioned at the same height. The hard masks 175 may include at least one of a metal (e.g., Ta, W, Ru, Ir, etc.) and a conductive metal nitride (e.g., TiN).

Figure 12:
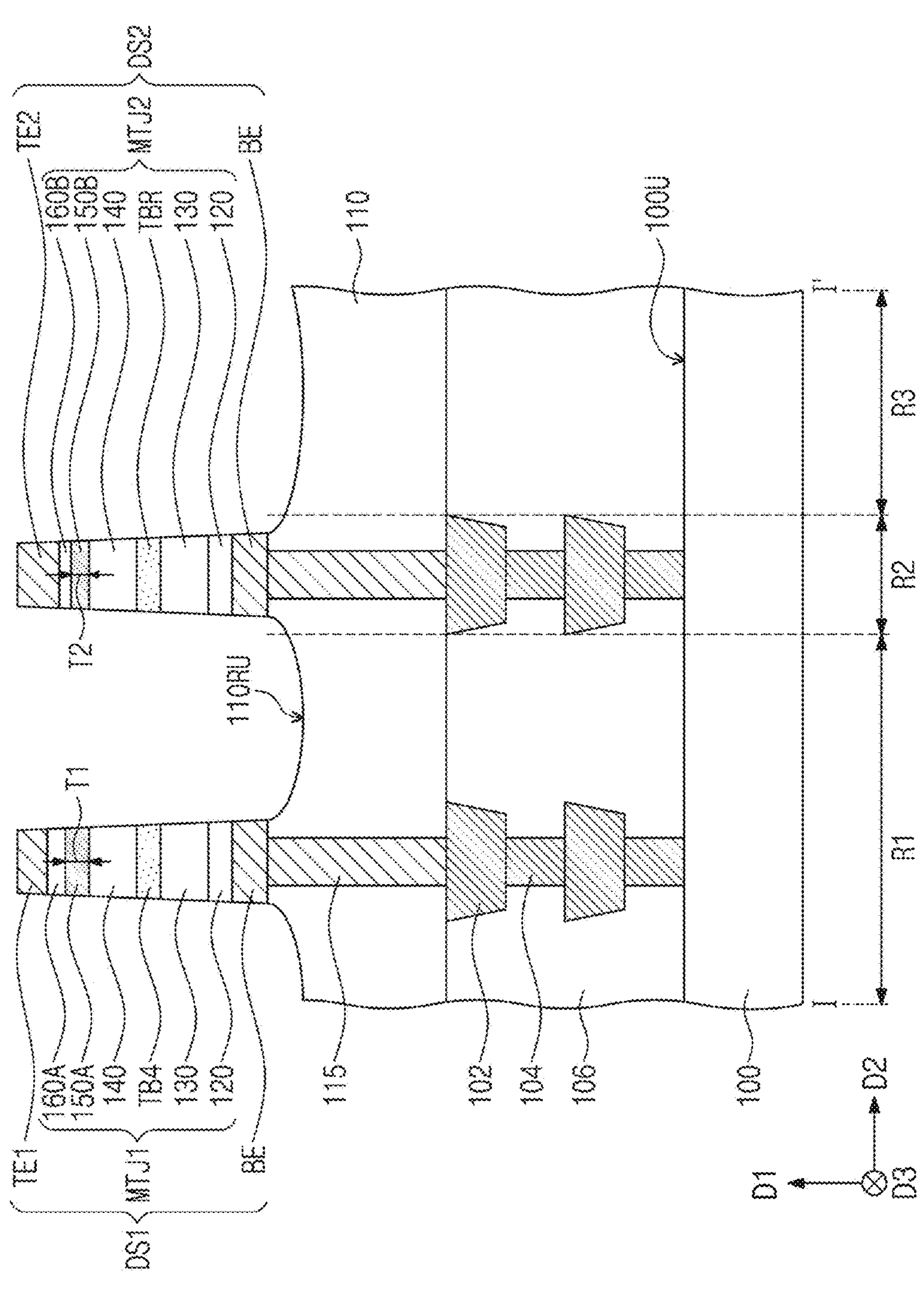

Referring to FIG. 12, the second deposition layer DL2, the first deposition layer DL1, and the bottom electrode layer BEL may be sequentially etched using the hard masks 175 as an etching mask. Accordingly, a first magnetic tunnel junction pattern MTJ1, a second magnetic tunnel junction pattern MTJ2, and bottom electrodes BE may be formed on the first interlayer insulating layer 110. The bottom electrodes BE may be respectively connected to the lower contact plugs 115, and the first and second magnetic tunnel junction patterns MTJ1 and MTJ2 may be respectively formed on the bottom electrodes BE.

Etching the first deposition layer DL1 and the second deposition layer DL2 may include sequentially etching the upper capping layer 160L, the capping layer 150L, the free magnetic layer 140L, the tunnel barrier layer TBRL, the pinned magnetic layer 130L, and the seed layer 120L using the hard masks 175 as an etch mask. Accordingly, the first magnetic tunnel junction pattern MTJ1 may include a seed pattern 120, a pinned magnetic pattern 130, a tunnel barrier pattern TBR, a free magnetic pattern 140, a first capping pattern 150A, and a first upper capping pattern 160A sequentially stacked on the first bottom electrode BE among the bottom electrodes BE. The second magnetic tunnel junction pattern MTJ2 may include a seed pattern 120, a pinned magnetic pattern 130, a tunnel barrier pattern TBR, a free magnetic pattern 140, a second capping pattern 150B, and a second upper capping pattern 160B sequentially stacked on the second bottom electrode BE among the bottom electrodes BE.

The etching process of etching the first deposition layer DL1, the second deposition layer DL2, and the bottom electrode layer BEL may be, for example, an ion beam etching process using an ion beam. The ion beam may include inert ions. An upper surface of the first interlayer insulating layer 110 may be recessed at both sides of the magnetic tunnel junction pattern MTJ by the ion beam etching process. Accordingly, the first interlayer insulating layer 110 may have a upper surface 110RU recessed at both sides of the magnetic tunnel junction pattern MTJ.

After the ion beam etching process, remaining portions of each of the hard masks 175 may remain on the first and second magnetic tunnel junction patterns MTJ1 and MTJ2. The remaining portions of the hard masks 175 may function as first and second top electrodes TE1 and TE2. Hereinafter, the remaining portions of the hard masks 175 may be referred to as first and second top electrodes TE1 and TE2. The first top electrode TE1, the first magnetic tunnel junction pattern MTJ1, and the first bottom electrode BE may constitute a first data storage pattern DS1. The second top electrode TE2, the second magnetic tunnel junction pattern MTJ2, and the second bottom electrode BE may constitute a second data storage pattern DS2.

By the etching process, the block structure 300 and the etch stop pattern 310 may be removed from the substrate 100. After the block structure 300 and the etch stop pattern 310 are removed, the first interlayer insulating layer 110 may be exposed.

Referring to FIG. 13, a protective insulating layer 170 may be formed on the first interlayer insulating layer 110 to cover the first and second data storage patterns DS1 and DS2. The protective insulating layer 170 may be formed to conformally cover upper and side surfaces of the first and second data storage patterns DS1 and DS2, and may extend along the recessed insulating layer 110RU of the first interlayer insulating layer 110. A second interlayer insulating layer 180 may be formed on the protective insulating layer 170 to cover the first and second data storage patterns DS1 and DS2.

Referring back to FIG. 4, portions of the second interlayer insulating layer 180 and the protective insulating layer 170 may be removed, and an upper surface of the top electrode TE of the data storage pattern DS may be exposed. An upper wiring 200 may be formed on the second interlayer insulating layer 180 and may cover the exposed upper surface of the top electrode TE. The upper wiring 200 may be electrically connected to the top electrode TE.

According to embodiments of inventive concepts of the present disclosure, the first capping pattern 150A and the second capping pattern 150B having different thicknesses may be manufactured through a single deposition process. That is, the first and second magnetic tunnel junction patterns MTJ1 and MTJ2 having different characteristics may be manufactured in a single process. A thickness difference between the first capping pattern 150A and the second capping pattern 150B may be adjusted using the height of the block structure 300 and the irradiation angle of the second beam B2. Accordingly, it is possible to provide a magnetic memory device with improved efficiency and a method of manufacturing the same.

Figure 14:
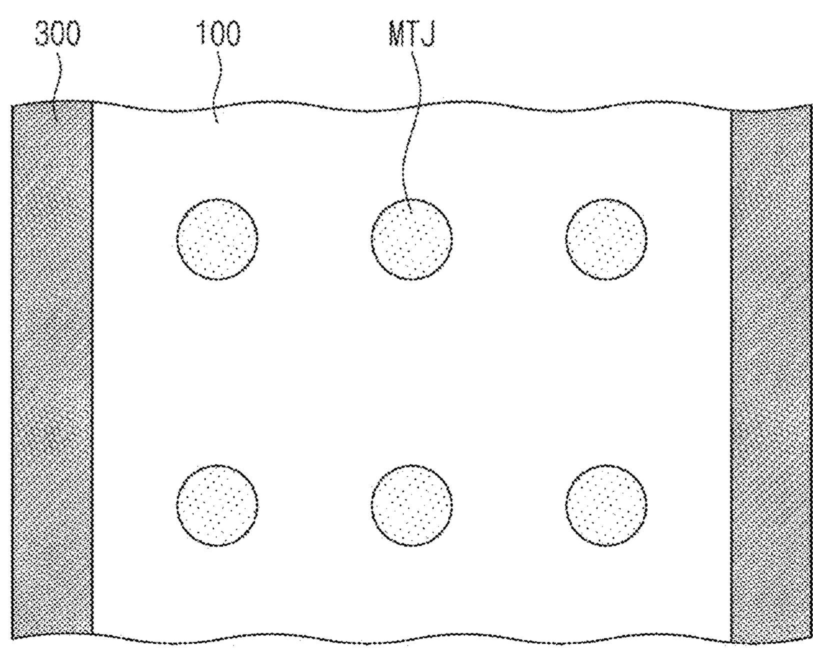
FIGS. 14 and 15 are plan views of magnetic memory devices according to some embodiments of the present disclosure.
Figure 15:
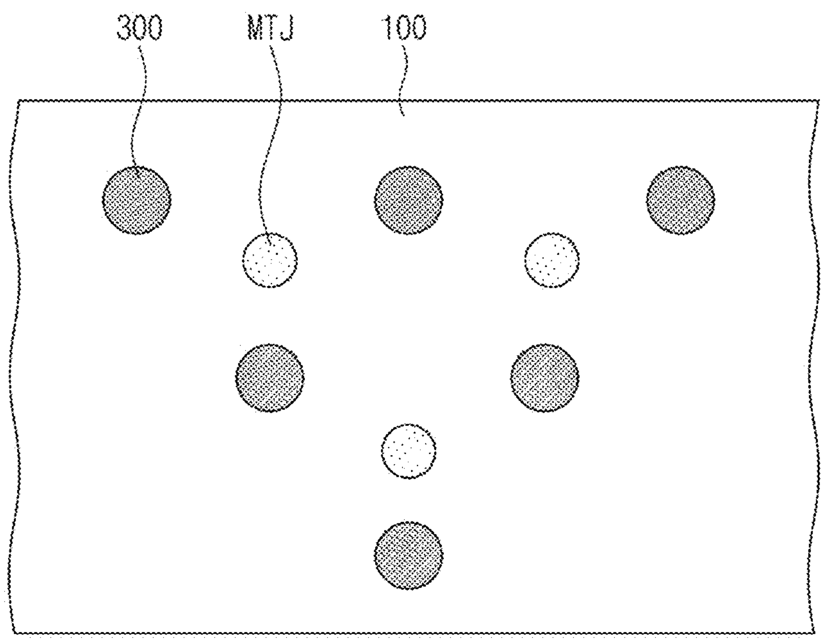

FIGS. 14 and 15 are plan views of magnetic memory devices according to some embodiments of the present disclosure. For simplicity of explanation, descriptions overlapping those of the magnetic memory device described with reference to FIGS. 5 to 13 will be omitted.

Referring to FIG. 14, a plurality of block structures 300 may be formed on the substrate 100. Each of the plurality of block structures 300 may have a wall shape extending in one direction parallel to the upper surface of the substrate 100. The plurality of block structures 300 may be horizontally spaced apart from each other. The magnetic tunnel junction patterns MTJ may be formed between the plurality of block structures 300.

Referring to FIG. 15, a plurality of block structures 300 may be formed on the substrate 100. Each of the plurality of block structures 300 may have a pillar shape extending in a direction perpendicular to the upper surface of the substrate 100. The plurality of block structures 300 may be horizontally spaced apart from each other. The magnetic tunnel junction patterns MTJ may be formed between the plurality of block structures 300. The magnetic tunnel junction patterns MTJ may be disposed between three adjacent block structures 300.

Figure 16:
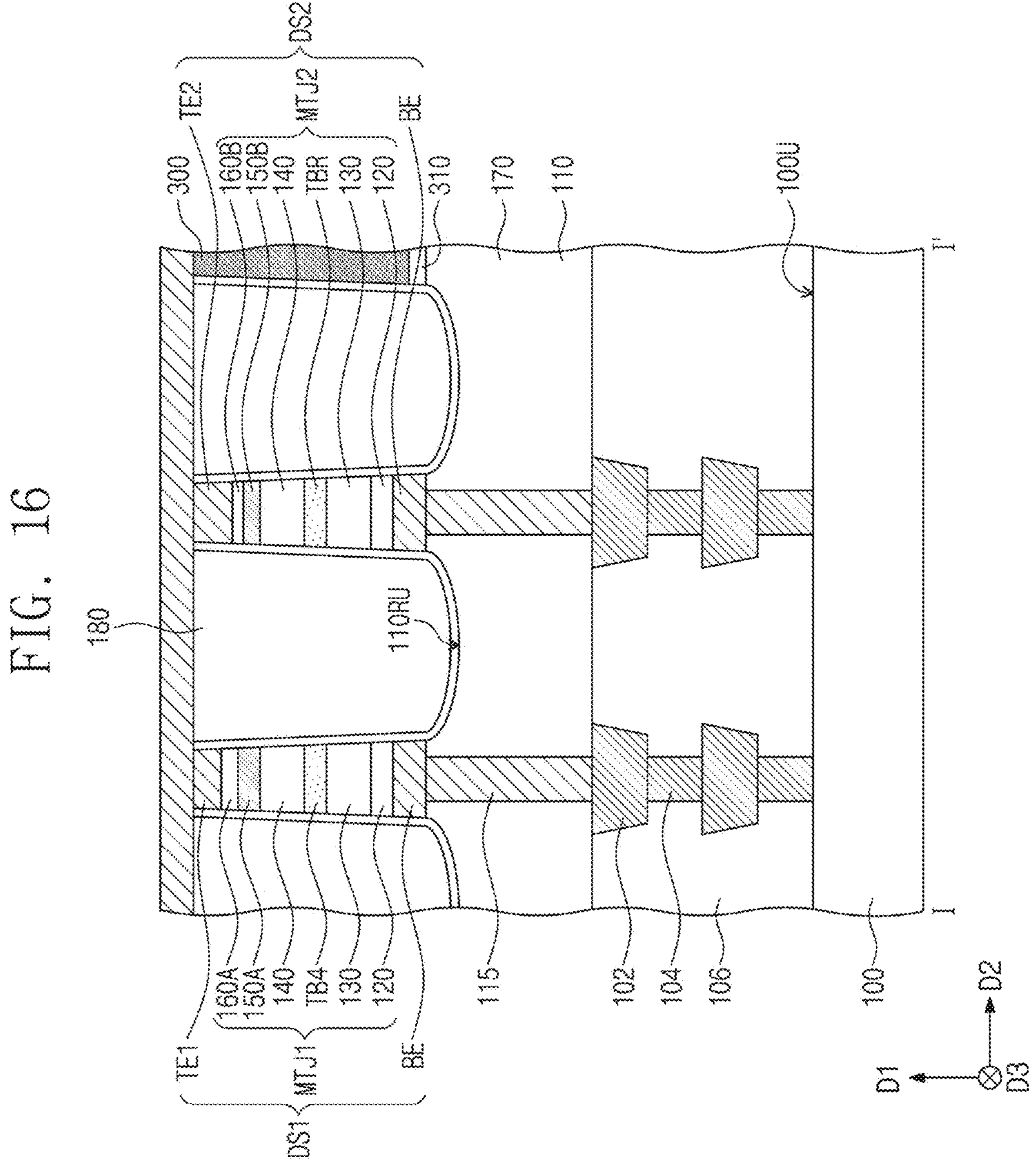
FIG. 16 is a cross-sectional view of a magnetic memory device according to some embodiments of the present disclosure.

FIG. 16 is a cross-sectional view of a magnetic memory device according to some embodiments of the present disclosure. For simplicity of description, descriptions overlapping those of the magnetic memory device described with reference to FIGS. 1 to 13 will be omitted.

Referring to FIGS. 12 and 16, a magnetic memory device according to some embodiments may include a block structure 300 and an etch stop pattern 310. During the etching process described with reference to FIG. 12, at least a portion of the block structure 300 may remain instead of being removed. In this case, the etch stop pattern 310 may be interposed between the remainder of the block structure 300 and the first interlayer insulating layer 110. The protective insulating layer 170 may further cover the remainder of the block structure 300 and side surfaces of the etch stop pattern 310. An upper surface of the remainder of the block structure 300 may be in contact with the upper wiring 200.

According to embodiments of inventive concepts of the present disclosure, the first capping pattern and the second capping pattern having different thicknesses may be manufactured in one deposition process. That is, the first and second magnetic tunnel junction patterns having different characteristics may be manufactured in a single process. The thickness difference between the first capping pattern and the second capping pattern may be adjusted using the height of the block structure and the irradiation angle of the beam used in the deposition process. Accordingly, it is possible to provide the magnetic memory device with the improved manufacturing process efficiency and the method of manufacturing the same.

While embodiments are described above, a person skilled in the art may understand that many modifications and variations are made without departing from the spirit and scope of the present disclosure defined in the following claims. Accordingly, example embodiments of the present disclosure should be considered in all respects as illustrative and not restrictive, with the spirit and scope of the present disclosure being indicated by the appended claims.

What is claimed is:

1. A method of manufacturing a magnetic memory device, the method comprising:

forming a bottom electrode layer on a substrate;

forming a block structure on the bottom electrode layer;

performing a first deposition process on the bottom electrode layer to form a pinned magnetic layer, a tunnel barrier layer, and a free magnetic layer on the bottom electrode layer, the pinned magnetic layer, the tunnel barrier layer, and the free magnetic layer adjacent to the block structure in a direction parallel to an upper surface of the substrate;

performing a second deposition process on the free magnetic layer to form a capping layer on the free magnetic layer; and performing an etching process after forming a hard mask on the capping layer to form magnetic tunnel junction patterns, wherein the first deposition process includes irradiating a first beam toward the substrate and the first beam forms a first angle with a normal line perpendicular to the upper surface of the substrate, wherein the second deposition process includes irradiating a second beam toward the substrate and the second beam forms a second angle with the normal line, and wherein the second angle is greater than the first angle.

2. The method of claim 1, wherein the substrate includes a first region and a second region, the forming the block structure on the bottom electrode layer provides the block structure adjacent to the second region, the capping layer includes a first capping layer and a second capping layer, the performing the second deposition process includes forming the first capping layer on the first region of the substrate and forming the second capping layer on the second region of the substrate, and a thickness of the first capping layer is greater than a thickness of the second capping layer.

3. The method of claim 1, wherein the block structure has a shape of a wall, and the block structure extends in a direction perpendicular to the upper surface of the substrate.

4. The method of claim 1, wherein the block structure includes silicon oxide.

5. The method of claim 1, wherein the second angle is 30° to 60°.

6. The method of claim 1, wherein the performing the etching process includes removing the block structure from the substrate.

7. The method of claim 1, wherein the forming the block structure on the bottom electrode layer includes forming a plurality of block structures on the bottom electrode layer, and the performing the etching process forms the magnetic tunnel junction patterns between the plurality of block structures.

8. The method of claim 1, wherein the capping layer includes tantalum (Ta).

9. The method of claim 1, wherein the performing the etching process includes:

etching the hard mask to form a top electrode; and etching the bottom electrode layer to form a bottom electrode.

10. The method of claim 1, wherein the substrate includes a first region and a second region, the forming the block structure on the bottom electrode layer provides the block structure adjacent to the second region, the magnetic tunnel junction patterns include a first magnetic tunnel junction pattern on the first region and a second magnetic tunnel junction pattern on the second region, the first magnetic tunnel junction pattern includes a first capping pattern, the second magnetic tunnel junction pattern includes a second capping pattern, and a thickness of the first capping pattern is greater than a thickness of the second capping pattern.

11. The method of claim 1, further comprising:

performing a planarization process after forming the hard mask.

12. The method of claim 1, further comprising:

forming a protective insulating layer on the magnetic tunnel junction patterns after the performing the etching process; and forming an interlayer insulating layer on the protective insulating layer.

13. The method of claim 1, wherein the performing the second deposition process further includes forming upper capping layers.

14. The method of claim 1, wherein each of the pinned magnetic layer and the free magnetic layer has a magnetization direction perpendicular to an interface between the free magnetic layer and the tunnel barrier layer.

15. A method of manufacturing a magnetic memory device, the method comprising:

providing a substrate including a block structure;

performing a first deposition process including irradiating a first beam on the substrate to form a first deposition layer, the first deposition layer adjacent to the block structure in a direction parallel to an upper surface of the substrate; and performing a second deposition process including irradiating a second beam on the first deposition layer to form a second deposition layer, wherein the first beam forms a first angle with respect to a normal line perpendicular to the upper surface of the substrate, the second beam forms a second angle with respect to the normal line, and the second angle is greater than the first angle.

16. The method of claim 15, wherein the substrate includes a first region including the block structure and a second region adjacent to the first region, and a thickness of the second deposition layer at the first region is smaller than a thickness of the second deposition layer at the second region.

17. The method of claim 15, wherein an upper surface of the block structure is higher than an uppermost surface of the second deposition layer.

18. The method of claim 15, wherein the first deposition layer includes a pinned magnetic layer, a tunnel barrier layer, and a free magnetic layer, and the second deposition layer includes a capping layer.

19. A method of manufacturing a magnetic memory device, the method comprising:

forming a lower interlayer insulating layer including lower wirings on a substrate, the substrate including a first region, a second region, and a third region neighboring in a first direction parallel to the substrate;

forming a first interlayer insulating layer including lower contact plugs on the lower interlayer insulating layer;

forming a bottom electrode layer on the lower interlayer insulating layer;

forming a block structure on the bottom electrode layer, the block structure being formed on the third region of the substrate;

performing a first deposition process on the bottom electrode layer, the first deposition process including irradiating a first beam having a first angle with a normal line perpendicular to an upper surface of the substrate, the first deposition process including forming a pinned magnetic layer, a tunnel barrier layer, and a free magnetic layer;

performing a second deposition process on the free magnetic layer, the second deposition process including irradiating a second beam having a second angle with the normal line, the second deposition process forming a capping layer;

performing a planarization process after forming a hard mask on the capping layer;

performing an etching process on the hard mask to form magnetic tunnel junction patterns; and forming an upper wiring on the magnetic tunnel junction patterns, wherein the second angle is greater than the first angle, and a thickness of the capping layer on the first region of the substrate is greater than a thickness of the capping layer on the second region of the substrate.

20. The method of claim 19, the capping layer includes tantalum (Ta).

* * * * *